United States Patent
Gao

(10) Patent No.: US 11,659,683 B1
(45) Date of Patent: May 23, 2023

(54) HIGH POWER DENSITY SERVER WITH HYBRID THERMAL MANAGEMENT

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/544,632

(22) Filed: Dec. 7, 2021

(51) Int. Cl.
*H05K 7/20* (2006.01)
*G06F 1/20* (2006.01)

(52) U.S. Cl.
CPC ........... *H05K 7/20218* (2013.01); *G06F 1/20* (2013.01); *H05K 7/2079* (2013.01); *H05K 7/20781* (2013.01); *G06F 2200/201* (2013.01)

(58) Field of Classification Search
CPC ........... H05K 7/20218; H05K 7/20781; H05K 7/2079; G06F 2200/201
See application file for complete search history.

(56) References Cited

U.S. PATENT DOCUMENTS 11,116,113 B2 * 9/2021 Chiu .................. H05K 7/20318
2022/0408587 A1 * 12/2022 Kelley ............... H05K 7/20327

* cited by examiner

*Primary Examiner* — Mukundbhai G Patel
(74) *Attorney, Agent, or Firm* — Womble Bond Dickinson (US) LLP

(57) ABSTRACT

An information technology (IT) enclosure may have a hybrid architecture. Such an enclosure may include an immersion tank that holds a single-phase coolant fluid. One or more servers may be immersed in the tank. The server chassis may have electronics that are thermally coupled to a two-phase fluid via a thermosiphon loop. The server chassis includes a condensing unit forming the thermosiphon loop and the condensing unit is submerged in the single phase fluid.

20 Claims, 6 Drawing Sheets

HIGH POWER DENSITY SERVER WITH HYBRID THERMAL MANAGEMENT

FIELD

Embodiments of the present disclosure relate generally to electronics cooling for servers in an information technology (IT) tank. In particular, the servers may have a hybrid thermal management architecture to cool IT equipment.

BACKGROUND

Information Technology (IT) includes technology such as computers that are accessible through the internet or a local network. IT equipment may be used to perform data storage, support front-end websites, back-end applications, services, and more. IT equipment, such as servers and other electronic components (e.g., peripheral devices), may be physically installed in a server chassis. These server chassis can then be installed in an IT enclosure, which may also be referred to as an IT rack. An IT enclosure may include electric, mechanical, and thermal management infrastructure that houses, cools, monitors, provides power to, and connects the IT equipment to the internet. A data center may be understood as a facility that is dedicated to supporting and housing many IT enclosures.

High power servers, such as, for example, servers that perform artificial intelligence based operations, may generate large amounts of thermal energy. These high power servers and server chassis that houses them, may be immersed in a fluid that absorbs thermal energy from the electronics. In this immersion cooling system, computer electronics can be immersed in, and in direct contact with, a non-electrically conductive fluid (e.g., a liquid). The temperature of this immersion fluid can be controlled within a defined 'safe range', for example, with a heat exchanger and pump, thereby cooling the IT equipment.

An immersion cooling system can have a higher heat transfer capability than traditional air and liquid cooling systems such as, for example, direct-to-chip thermal management using heat sinks or cold plates. Immersion cooling systems may greatly reduce the physical footprint of servers because the electronics can be packaged much closer together without overheating. As such, due to higher packaging density and increased computing load of electronics, immersion cooling for high power density electronics is an attractive cooling solution. An immersion cooling system, however, may have inefficiencies and other drawbacks. Thus, a hybrid cooling solution that addresses inefficiencies and other drawbacks of an immersion cooling system may be beneficial in an IT enclosure.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
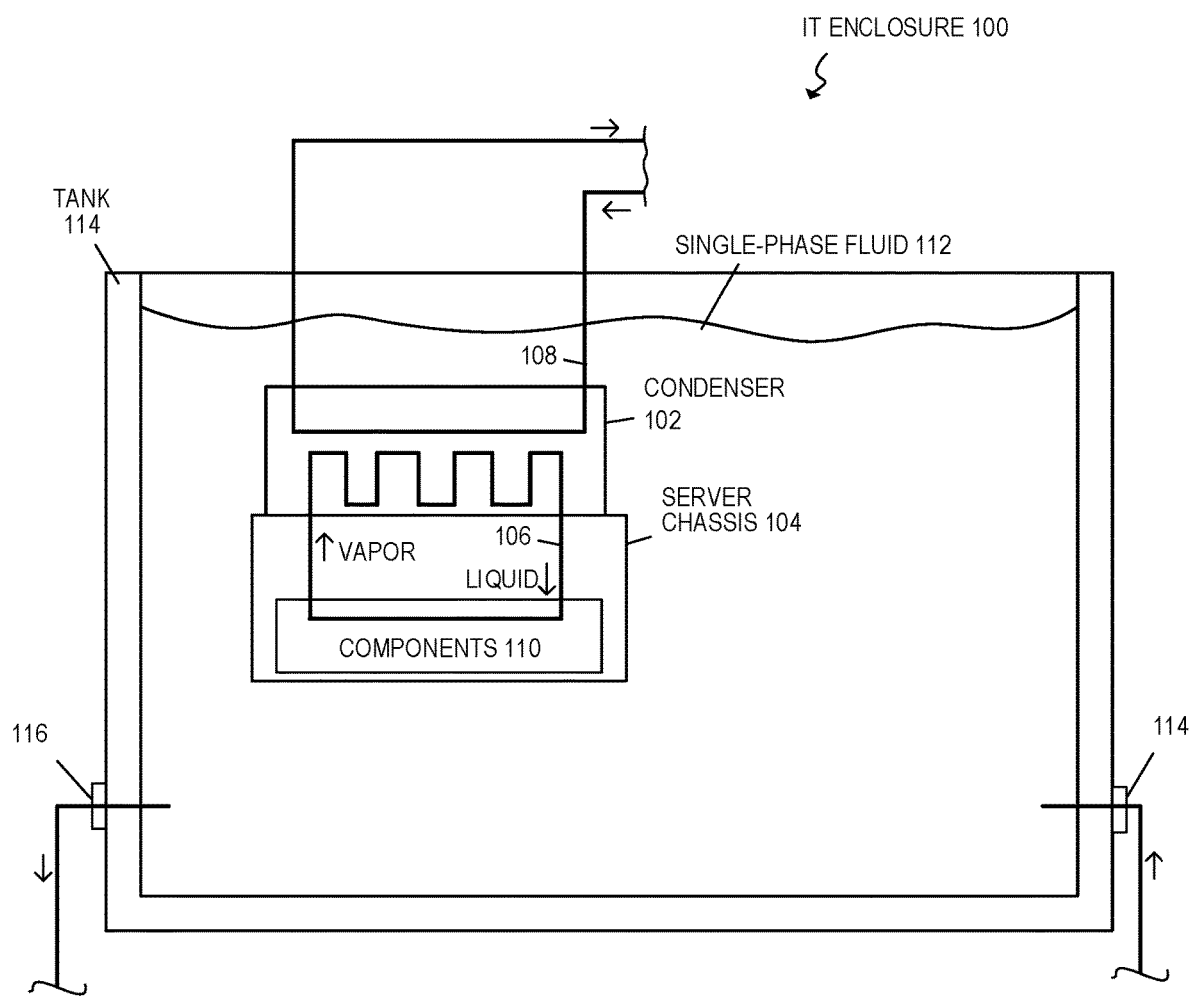
FIG. 1 shows an IT enclosure with hybrid cooling architecture, according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

An IT enclosure may be populated with a plurality of server chassis. Each server chassis may house one or more printed circuit boards that may be populated with electronic components such as, for example, integrated circuits (ICs), system on integrated chip (SOICs), processors, memory, resistors, capacitors, inductors, semi-conductors, power converters, and other electronic components. The electronic components may include hardware and/or software that may collectively form one or more servers that connect to the internet. Each server chassis can serve to manage power, thermal requirements, electronic connectivity, structural support, and other considerations of the server.

As discussed, power consumption for servers continues to increase, due to the growing needs of some applications such as, for example, artificial intelligence or block chain. To support some applications, a server may include high power density chips. An IT enclosure may implement immersion cooling to support such applications, however, immersion cooling is not without issues.

In some cases, hotspots may form within an immersion tank. The flow of immersion fluid within an immersion tank may be unpredictable and difficult to control on a granular level. As such, hotspots may develop within the tank. Such hotpots may risk damage to IT equipment and introduce inefficiencies to the system.

For example, a brute force approach to addressing hotspots may be to increase the overall flow rate within the tank by increasing the effort of a pump. Additionally, or alternatively, the effort of cooling the overall immersion fluid through a heat exchanger may be increased. In such cases, a large effort may be drawn towards cooling or moving all of the immersion fluid, in order to reach a potentially small hotspot region. Such an approach is inefficient at best, and at worst, may still not sufficiently cool the hotspot, which may pose a risk to the equipment. As such, a more targeted approach that utilizes a hybrid cooling architecture may improve reliability and efficiency of a traditional immersion tank.

Further, some servers in an IT enclosure may need more cooling than others. Similarly, some servers may garner more protection than others, depending on how critical their role is deemed to be. As such, it may be beneficial for an IT enclosure to manage non-uniform power densities for various servers and different server hardware with varying levels of criticality. Embodiments of the present disclosure can address issues identified, such as hotspots, reliability, efficiency, non-uniform power densities, different server hardware, and more.

Generally, an IT enclosure can have a tank that holds a single-phase fluid which may also be referred to as an immersion fluid. This single-phase fluid may be a liquid such as a non-conductive liquid. One or more server chassis may be populated to the IT enclosure, such that they are immersed in the immersion fluid. Further, electronics that are housed by each server chassis may be thermally coupled to a two-phase fluid. This two-phase fluid can absorb energy from the electronics through evaporation—changing the two-phase fluid from a liquid state to a vapor state. The vapor may passively travel to a condenser (due to gravity and pressure). The condenser can condense the vapor to liquid, and the two-phase fluid may return to the electronics in liquid form to repeat the process in what may be understood as a thermosiphon system. Thus, the electronics in a server chassis may be cooled by immersion and by thermosiphon. Potential hotspots and risk of damage to IT equipment may be mitigated in an efficient and targeted manner.

Further, the IT enclosure may include liquid-cooled servers, rather than or in addition to the thermosiphon-cooled servers. For example, a condenser may extract thermal energy from a first server with a liquid coolant, and a second server with a two-phase fluid. Thus, the IT enclosure can support a variety of server hardware and applications having non-uniform thermal needs.

FIG. 1 shows an IT enclosure 100 that has a hybrid cooling architecture, according to some embodiments. The IT enclosure may include a tank 114 that holds a single-phase fluid 112. This single-phase fluid may be a non-conductive fluid so as not to short electronics of components 110. The single-phase fluid may be in direct contact with electronics such as PCBs, processors, active and passive electronic components, energy storage, or other electronics.

Tank 114 may include one or more retaining walls that forms a space into which the single-phase fluid 112 may be held. A tank may have a variety of shapes such as, for example, rectangular, oval shaped, circular, or other enclosed shape that forms a space to hold the single-phase fluid.

The tank may include one or more receiving ports 114 that receive the single-phase fluid, and one or more draining ports 116 through which the single-phase fluid exits. The single-phase fluid may be circulated through the tank at a preset and/or varying flow rate, depending on application. The single-phase fluid may be actively or passively chilled, external to the tank. For example, a pump can push or pull the single-phase fluid through the tank. A heat exchanger or other cooling system may cool this single-phase fluid, external to the tank 114. A pump and heat exchanger may be present upstream of the receiving ports and/or downstream of the draining ports.

The IT enclosure 100 may include one or more server chassis 104 that are immersed in the single-phase fluid within the tank. Each server chassis may include components 110, such as, for example, a PCB board and electronics. Components 110 may also include a two-phase cold plate or heatsink that is thermally coupled to the electronics. These components may be directly submerged in the single-phase fluid 112. As such, the electronic components housed by server chassis 104 may benefit from thermosiphon cooling, as well as immersion cooling. The thermosiphon cooling can reduce the risk of a hotspot around the electronics and improve reliability. In some cases, as described, a server may not utilize a thermosiphon loop. In such a case, components 110 may include a liquid-cooled cold plate.

The IT enclosure 100 may include one or more condensers 102. A condenser 102 may include a thermosiphon loop 106 that that receives and returns a two-phase fluid from and to components 110, which may include electronics which are housed by each of the one or more server chassis 104. A portion of the thermosiphon loop may be understood a riser (where the two-phase fluid, in vapor form, rises from components 110 into the condenser 102). Another portion of the thermosiphon loop may be understood as the condenser 102, where the two-phase fluid undergoes phase change from vapor to liquid. Another portion of the thermosiphon loop may be understood as a down corner, where the two-phase fluid, in liquid form, falls down to the components 110. Another portion of the thermosiphon loop may be understood as an evaporator, such as, for example, a cold plate or heat sink in components 110, where the two-phase fluid undergoes phase change from liquid to vapor.

A liquid cooling loop 108 may be thermally coupled to the thermosiphon loop 106 to condense the two-phase fluid from vapor to liquid. A portion of the liquid cooling loop may be integral to the condenser, while the rest of it may be external to the condenser. For example, a supply manifold may supply liquid to the condenser and a return manifold may receive the liquid from the condenser.

Similarly, a portion of the thermosiphon loop 106 may be integral to the condenser, and the rest of it may be external to the condenser. For example, components 110 may include a two-phase cold plate through which the two-phase fluid is held and thermally coupled to the electronics.

In some embodiments, each of the one or more condensers 102 are immersed in and thermally coupled to the single-phase fluid within the tank. In such a manner, the condenser may condense some of the two-phase fluid in the thermosiphon loop 106 by extracting thermal energy from the vapor with the single-phase fluid 112 in addition to the liquid cooling loop 108.

It should be understood that hoses, conduit, pipes, connectors, junctions, or other fluid carrying hardware may be used to join the various components described to form the thermosiphon loop, the liquid cooling loop, and/or carry the fluids or liquids from or two other components. Various arrangements of such hardware may be implemented without departing from the scope of the present disclosure.

Further, components that are described as thermally coupled may transfer thermal energy between the components with a sufficient efficiency as given by trade knowledge. For example, thermally coupled may be characterized by a low thermal resistance. Such a thermal resistance may vary depending on circumstance and application but may be determined through routine experimentation. Components that are thermally coupled may be in direct contact with each other through a metal or a thermally conductive material with thermal resistance the same as or similar to that of copper, aluminum, steel, iron, or other metal. In some cases, components may be pressed together. Thermally conductive pastes may be used to join parts. In some examples, fluid loops may be thermally coupled together if they pass through a common thermally conductive medium (e.g., a machined plate). In some examples, fluid loops may be thermally coupled together if they conduit which they travel through are physically pressed together.

Further, fluid loops that are described as separate should be understood as being fluidly isolated from each other. For example, liquid cooling loop 108 is fluidly isolated from thermosiphon loop 106. Similarly, single-phase fluid 112 is fluidly isolated from liquid cooling loop 108 and thermosiphon loop 106.

The combination of condenser and server chassis shown here may be repeated within the IT enclosure to support a number of high power density servers. Further, some of the server chassis in the IT enclosure 100 may use liquid cooling rather than a two-phase thermosiphon cooling arrangement. In other cases, some server chassis may use both, as described in other sections. Thus, the IT enclosure 100 may support a variety of server hardware and requirements with an immersion tank and targeted additional cooling (e.g., liquid cooling and/or two-phase cooling for each server chassis).

Figure 2:
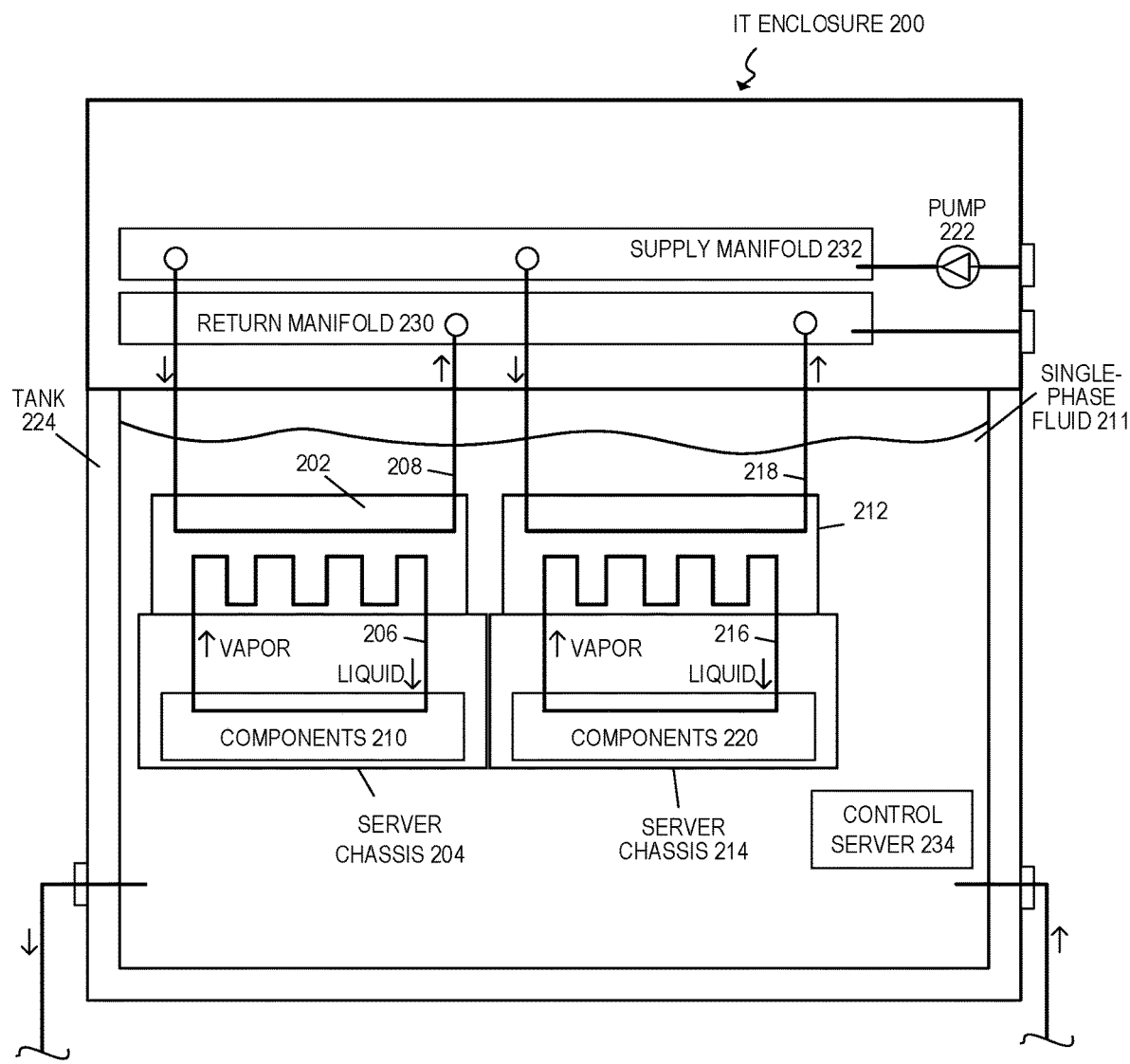
FIG. 2 shows an example IT enclosure with hybrid cooling architecture and control server, with additional hardware representations, according to some embodiments.

FIG. 2 shows an example IT enclosure 200 with hybrid cooling architecture, according to some embodiments. The IT enclosure may include an immersion tank 224 that holds a single-phase fluid 211. One or more server chassis such as server chassis 204 and server chassis 214 may be submerged in the single-phase fluid 211. Each of the server chassis may include components 210 and 220, respectively. Components 210 and 220 may include electronics, a PCB, and/or a two-phase cold plate or heatsink. Two-phase fluid may flow through a thermosiphon loop 206 and 216 in a thermosiphon process, as described in other sections.

The IT enclosure may include a pump 222 that pumps cooling liquid through to supply manifold 232 as shown, and/or from a return manifold 230. The cooling liquid may be supplied from an external source (not shown) through pump 222, into supply manifold 232. The cooling liquid may be water, glycol, or other liquid coolant.

The supply manifold 232 may supply the cooling liquid to one or more condensers such as condensers 202 and 212. Liquid may be distributed to each of the condensers through ports on the supply manifold. The liquid flows through each condenser, thereby absorbing thermal energy from the two-phase fluid in the respective thermosiphon loops (206, 216) and condensing the two-phase fluid. The cooling liquid may flow out of the condensers and into return manifold 230. The return manifold 230 may collect liquid from each of the server chassis in the IT enclosure, and direct the liquid out of the IT enclosure. The liquid can be cooled by an external cooling system, and then return back to the IT enclosure, for example, to pump 222. This cycle may be repeated to continuously supply a cooling liquid with a sufficiently low temperature to the components (210, 220) of the IT enclosure.

The IT enclosure may include a control server 234. The control server 234 may be configured to control pump 222. For example, the control server may monitor a temperature of the electronics of components 210 and 220, or other data. In some examples, the control server may read temperatures from one or more temperature sensors. For example, temperature sensors may be placed on components 210, 220, within the tank 224, and/or on a manifold. The control server 234 may monitor other information as well such as, for example, flow rate of a liquid loop, temperature of a liquid loop, fault status of a component, or other data. The control server 234 may increase or decrease the effort of pump 222 based on the temperature of the electronics, the temperature in a tank, the temperature of the cooling loop (208, 218), the temperature of a two-phase loop (206, 216) and/or the other data. In some examples, the control server may be communicatively coupled to pump 222 through a wired or wireless connection. The control server may send the pump a command (e.g., an analog or digital command) through the connection. In response to the command, the pump may increase or decrease a pump effort based on the command.

Figure 3:
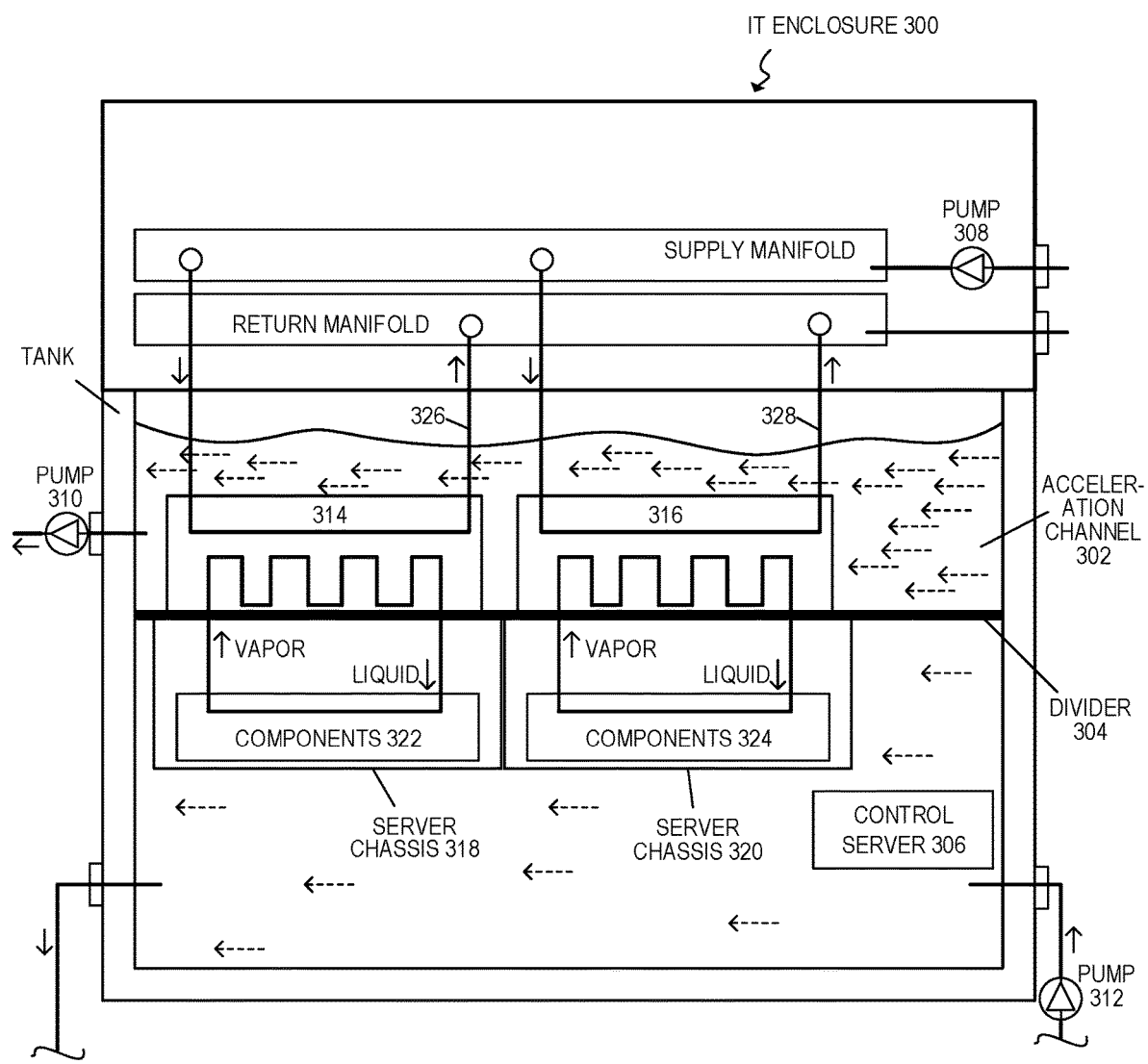
FIG. 3 shows an example IT enclosure with an acceleration channel, according to some embodiments.

FIG. 3 shows an example IT enclosure 300 with an acceleration channel 302, according to some embodiments. The acceleration channel is to accelerate the flow of the single phase fluid through the condensers to improve the thermal exchange. In this design, the single phase fluid is used as the secondary cooling fluid for condensing the vapor through the condenser. As described, an IT enclosure 300 may include a tank with a single-phase fluid in which server chassis 318 and 320 are immersed. Each server chassis may have components 322 and 324 that are each cooled through separate thermosiphon loops. Each thermosiphon loop may be condensed by a respective condenser 314 and 316. Further, each of these condensers may be submerged in the immersion fluid that is held in the tank. As such, each of the condensers may use the single-phase fluid (e.g., the immersion fluid), as well as a separate liquid cooling loop, to condense the two-phase fluid in the thermosiphon loop.

In this example, the tank includes an acceleration channel 302 that directs the single-phase fluid over or through each of the one or more condensers (e.g., 314 and 316). The single-phase fluid may flow in this channel at a higher flow rate than the single-phase fluid that is in the tank but outside of the acceleration channel. Thus, the system may be operated with improved efficiency by targeting the flow of the fluid in specific regions of the tank.

Acceleration channel 302 may include a divider 304 that may be formed by one or more walls within the tank. A first pump 310 may be fluidly connected to the tank to pump the single-phase fluid from the acceleration channel resulting in the higher flow rate within the acceleration channel. In some aspects, divider 304 may have one or more openings that fluidly connect the acceleration channel to the remaining portion of the tank. For example, one or more walls that form the divider may have a grid pattern or have a network of openings. As such, although fluid may travel between the acceleration channel and the rest of the tank, the flow rate within the acceleration channel may be higher than that in the rest of the tank, as shown by the dashed arrows.

As discussed, a control server 306 may control any of the pumps of the IT enclosure through one or more commands. In some cases, the control command may include an ON or an OFF command. In some examples, the control command may specify an increase effort or decrease effort command. The control command may also include a value within a range, for example, a value from 'X' to 'Y', where 'X' may represent OFF, and 'Y' may represent a maximum effort.

A control server 306 may include one or more control algorithms to manage the effort of each pump in a coordinated manner. As discussed, the pumps may be controlled in response to sensed temperature, flow rate, or other data. In some examples, the temperature of various components 322, 324 may be sensed. In some examples, the temperature of the immersion fluid may be measured. In some examples, the flow rate of the immersion fluid may be measured in and outside of the tank.

In some embodiments, a control server 306 may be configured to control a second pump 308 that is fluidly connected to the liquid cooling loop to control a liquid flow rate within the one or more liquid cooling loops 326 and 328. In some aspects, the control server may activate or increase the effort of second pump 308 in response to a temperature of a condenser (314 or 316) or components (322 or 324) being above a threshold temperature. Additionally, or alternatively, the control server may activate or increase the effort of the second pump 308 in response to a flow rate of the immersion fluid (e.g., through the acceleration channel 302) being below a threshold flow rate. The control server may deactivate or reduce an effort of pump 308 when the thresholds are satisfied.

In some embodiments, the control server may be configured to control a third pump 312 that is fluidly connected to the single-phase fluid in the tank outside of the acceleration channel. The control server may be configured to maintain pump 312 at a preset or default value, or a control loop (e.g., a PI or PID control algorithm) may be implemented to maintain a preset temperature of the immersion fluid. In some examples, the control server may activate or increase an effort of pump 312 in response to the temperature of the components (322 or 324) and/or the temperature of the single-phase fluid being above a temperature threshold, and/or in response to the flow rate of the immersion fluid being below a threshold. The control server may deactivate or reduce an effort of pump 312 when the thresholds are satisfied or based on a control algorithm.

In some aspects, if the flow rate in the acceleration channel is below a threshold, and/or if the temperature of a condenser, the single-phase fluid, and/or any of the components are above a threshold, then the control server 306 may activate or increase an effort of pump 310 and/or pump 312. The control server may respond by activating pump 310 to target the condensers, or both 310 and 312 to increase the overall flow rate of the single-phase fluid, which may decrease the overall temperature of the single-phase fluid in the tank. The control server may operate just the pump 310 first, then if the temperature and/or flow rate does not satisfy the thresholds, then the control server may operate pump 312. Further, if the temperature of the electronics or the condensers still does not satisfy the thresholds, the control server may operate pump 308. Thus, the control server may operate each of the pumps individually based on preset criteria (e.g., thresholds) to increase or decrease cooling effort as-needed, and in a targeted manner to address potential hotspots, thereby improving efficiency.

Figure 4:
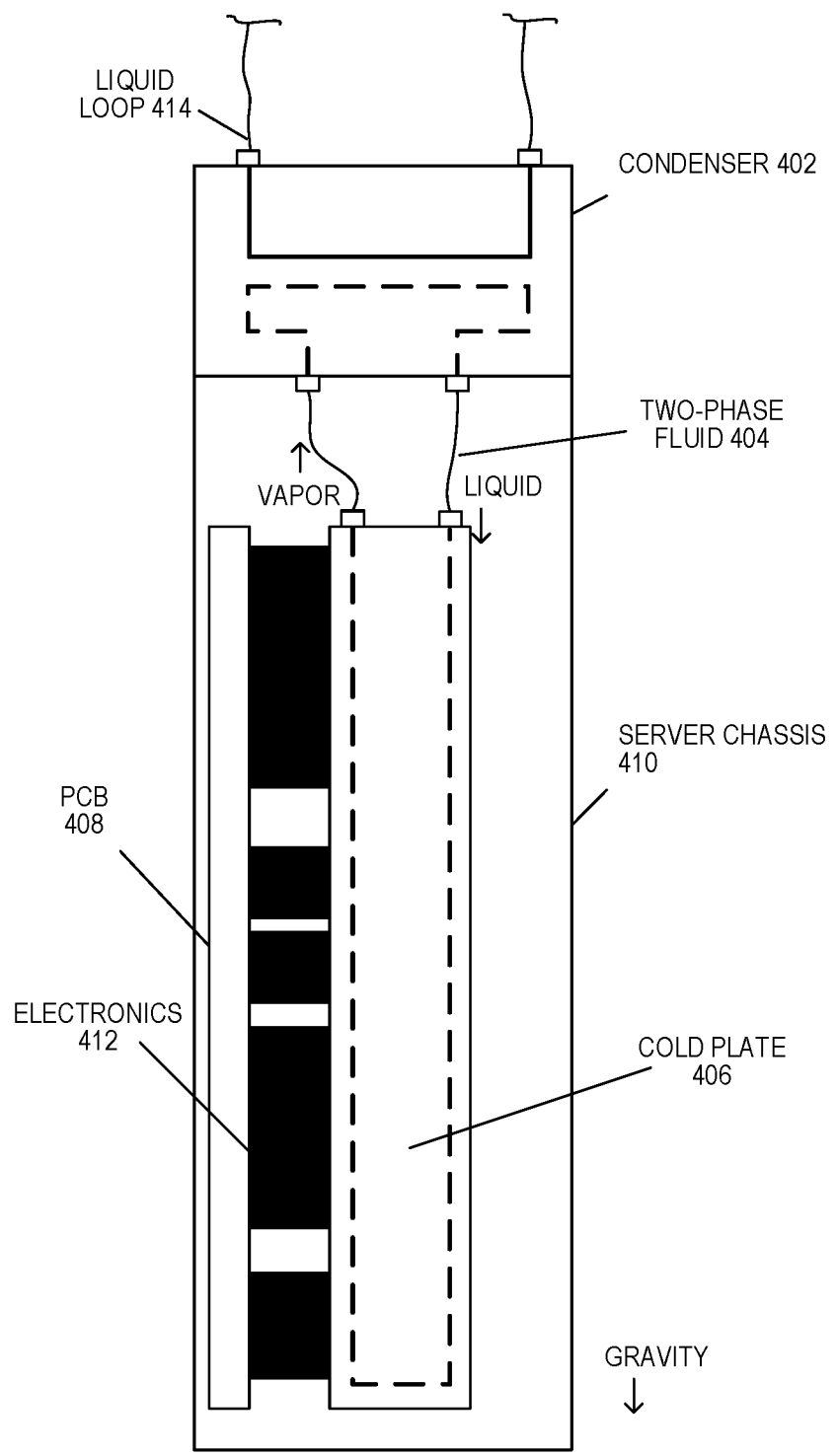
FIG. 4 shows an example server chassis of an IT enclosure, according to some embodiments.

FIG. 4 shows an example server chassis 410 of an IT enclosure, according to some embodiments. The example server chassis 410 and condenser 402 shown may be populated to an IT enclosure as described in other sections. A server chassis 410 may include mechanical support structures such as a frame, sheet metal, brackets, mounting hardware, and/or other mechanical components. The server chassis 410 may have an open frame so that, when immersed in an IT enclosure, components 412, 408, 406, and/or 402 may also be immersed and in physical contact with the immersion fluid.

One or more printed circuit boards 408 may be fixed to the server chassis, using screws, stands, bolts, clips, or other hardware. Electronics 412 may be populated to the one or more printed circuit boards. As described, electronics may include active or passive electronic components, a processor, memory, or other electronic components. A cold plate 406 may be physically and thermally coupled to some or all of the electronics 412, to extract thermal energy from the electronics.

The cold plate 406, which may also be understood as a heat sink, may house a two-phase fluid 404 that vaporizes in the cold plate when absorbing thermal energy from the electronics. The two-phase fluid, in vapor form, may rise into condenser 402. In condenser 402, thermal energy is absorbed from the two-phase fluid. The vapor may phase change to liquid form. Gravity may pull the two-phase fluid, in liquid form, back to cold plate 406. The thermosiphon process may repeat. The path of the two-phase fluid through the cold plate and condenser, and any hardware between, may be referred to as a thermosiphon loop.

As discussed, the condenser 402 may circulate a cooling liquid through liquid loop 414. In the condenser, the cooling liquid may be thermally coupled to the two-phase fluid to absorb thermal energy from the two-phase fluid, thereby condensing the two-phase fluid to liquid form. In some aspects, the condenser 402 may also thermally connect a single-phase fluid (e.g., an immersion fluid) with the two-phase fluid. In some cases, the condenser connects to or is integrated within the server chassis 410 such that the condenser is positioned above the cold plate, so that gravity and pressure passively circulates the vapor from the cold plate to the condenser and the liquid from the condenser back to the cold plate. As such, the pump speed and/or cooling of the cooling fluid may be reduced because of the added thermal absorbing contribution from the immersion fluid. Efficiency may be improved.

In some aspects, server chassis 410 may use a cooling fluid through the cold plate rather than a two-phase fluid. In such a case, a pump that is not shown may be used to circulate fluid between the cold plate 406 and the condenser 402. The server chassis may be populated to the IT enclosure in the vertical manner as shown in FIG. 4.

Figure 5:
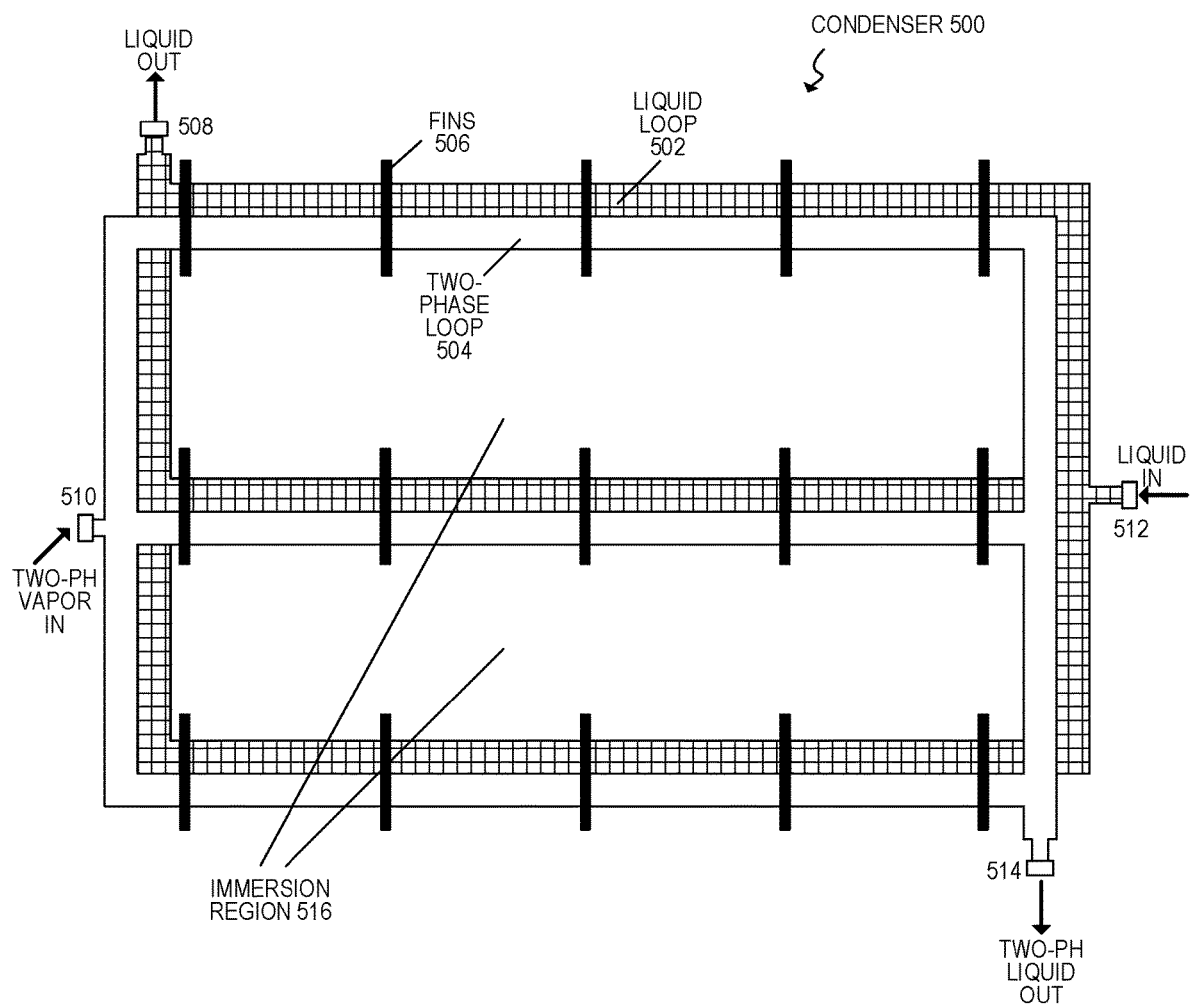
FIG. 5 shows an example condenser of an IT enclosure which may be integrated with a server on a server chassis, according to some embodiments.

FIG. 5 shows an example condenser of an IT enclosure, according to some embodiments. A condenser 500 may include an inlet port 510 that receives two-phase fluid (in vapor form), and an outlet port 514 through which the two-phase fluid exits (in liquid form). One or more fluid channels may carry the two-phase fluid from inlet port 510 to outlet port 514. This path in the condenser may be referred to as a thermosiphon loop or a portion of the thermosiphon loop.

The condenser may further include an inlet port 512 that receives cooling liquid, and an outlet port 508 through which the cooling liquid exits. One or more liquid channels may carry the cooling liquid from the inlet port 512 to the outlet port 508. This path of the cooling liquid may be understood as a cooling loop or a portion of the cooling loop.

Each of the one or more condensers may include a region (e.g., immersion regions 516) that may form one or more paths in which the single-phase fluid flows through when the condenser is installed within the tank of an IT enclosure. The single-phase fluid may be in direct contact with at least a section of the thermosiphon loop that comprises the two-phase fluid flowing from the inlet port 510 to the outlet port 514. For example, conduit that holds the single-phase fluid and/or the cooling liquid may be submerged in the single-phase fluid and thus, in direct contact with the single-phase fluid.

In some examples, condenser 500 may include one or more fins 506 that are thermally coupled to the thermosiphon loop. The fins may also be in fluid connection with immersion regions 516. Thus, the fins may be in physical contact with the single-phase fluid when the condenser is submerged in the tank of an IT enclosure, thereby improving the thermal energy transfer between the single-phase fluid and the thermosiphon loop.

Figure 6:
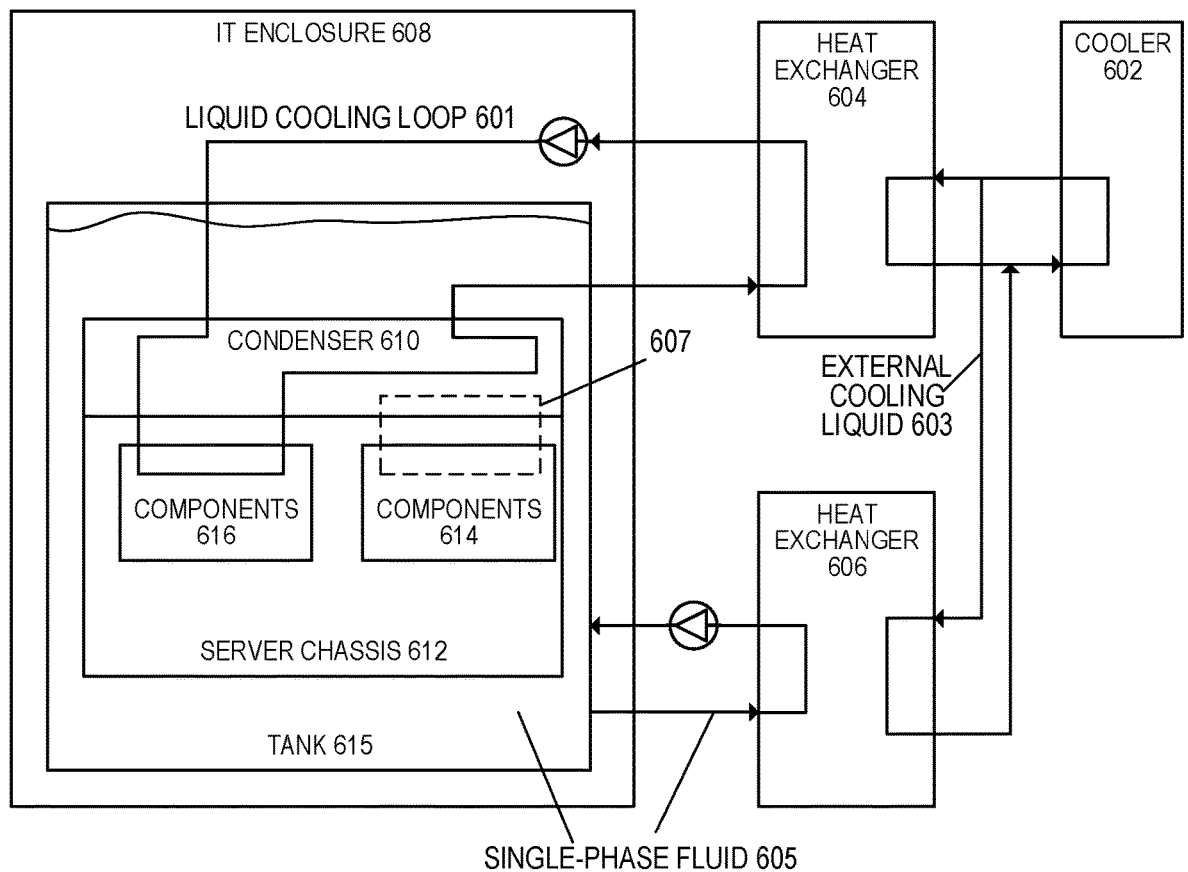
FIG. 6 an example cooling system for an IT enclosure, according to some embodiments.

FIG. 6 an example cooling system for an IT enclosure 608, according to some embodiments. The system may include a first heat exchanger 604 which is fluidly coupled to the liquid cooling loop 601 and a second heat exchanger 606 which is fluidly coupled to the single-phase fluid held in an immersion tank 615. A common cooling system 602 such as a refrigerated cooling system or a chiller may supply an external fluid to the first heat exchanger and the second heat exchanger. In such a manner, a common cooling system may be used to transfer thermal energy from the single-phase fluid and the cooling liquid, thereby reducing components and improving reliability and efficiency. As shown, heat exchanger 604 receives hot liquid coolant through the liquid cooling loop 601 and cools it using cooling fluid from cooler 602. Similarly, heat exchanger 606 receives hot single-phase fluid 605 from tank 615 and cools it using the same cooling fluid from the same cooler 602. The two heat exchangers 604 and 606 may be different but the cooling fluid used by both may share a common source, from cooler 602. In an embodiment, the two heat exchangers are fully separated.

In some embodiments, a server chassis 612 may include some components that support and use a thermosiphon loop, and other components that support and use the liquid cooling loop directly. For example, components 614 may include a cooling plate that houses a two-phase fluid 607 as-described in other sections. Components 616, however, may include a liquid cold plate that is physically and thermally attached to electronics of components 616. The liquid cold plate may circulate the liquid coolant to and from the condenser 610.

Condenser 610 may have liquid cooling lines routed to be thermally connected to a thermosiphon loop 607 within the condenser that circulates two-phase fluid to and from components 614. These liquid cooling lines of condenser 610 may also circulate liquid coolant to the components 616. Further, the condenser 610 may also be immersed in single-phase fluid 605, as described in other sections. The single-phase fluid may be thermally coupled to the liquid cooling loop and/or thermosiphon loop within the condenser 610. As such, the cooling liquid in loop 601, the single-phase fluid 605, and the two-phase fluid 607 may equalize each other to further improve efficiency and reduce potential hotspots.

In some embodiments, a data center may support a plurality of IT enclosures such as those described in the present disclosure. A data center may provide electricity, air conditioning, liquid cooling, fault monitoring, temperature monitoring, space, and other supporting infrastructure for each of the IT enclosures. For example, a data center may include one or more coolers, and heat exchangers as shown in FIG. 6 to support any number of IT enclosures.

An IT enclosure of any of the embodiments shown may include a plurality of server chassis. Each of the server chassis or condensers thereof may receive cooling liquid from a common supply manifold of the IT enclosure. Similarly, each of the server chassis or condensers may return the cooling liquid to a common return manifold of the IT enclosure. Manifolds can reduce the number of fluid lines and connectors within a system by using a common structure (e.g., a shared fluid channel) for distribution or collection of fluid.

Whether or not it is shown as such in each example, an IT enclosure may fluidly connect to an external liquid coolant supply source that can include a pump, a liquid cooler, and/or other components. It should be understood that some details such as connectors, conduit, pipe fittings, sensors, wiring, and other details may be omitted for the sake of clarity, however, such details may be present in any of the embodiments.

Furthermore, although not shown, an IT enclosure can, in some embodiments, include various other supporting components. For example, a IT enclosure can include a cooling distribution unit (CDU), a rack management unit (RMU). A server chassis can also be understood as a line replaceable unit (LRU) that can be placed into an array of server slots.

Each of the server chassis may house one or more servers which may include one or more components such as, for example, central processing units or CPUs, graphical processing units (GPUs), memory, and/or storage devices. Each component may perform data processing tasks, where the component may include software installed in a storage device, loaded into the memory, and executed by one or more processors to perform the data processing tasks. At least some of these components may be attached to any of the cold plates as described above. A server may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Aspects of the IT enclosure can be flexible and deployable in different system architectures; for example, the system can be deployed with a localized pumping system (e.g., a closed system architecture) or central pumping system (e.g., an open system architecture).

Some embodiments, for example, a control server as described in some embodiments, may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it into be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. An internet technology (IT) enclosure, comprising:
a tank that holds a single-phase fluid;
one or more server chassis immersed in the single-phase fluid within the tank; and
one or more condensers, each comprising
a thermosiphon loop that receives and returns a two-phase fluid from and to electronics which are housed by each of the one or more server chassis, and
a liquid cooling loop that is thermally coupled to the thermosiphon loop to condense the two-phase fluid from vapor to liquid.

2. The IT enclosure of claim 1, wherein each of the one or more condensers are immersed in and thermally coupled to the single-phase fluid within the tank.

3. The IT enclosure of claim 1, wherein each of the one or more condensers includes paths in which the single-phase fluid flows through such that the single-phase fluid is in direct contact with conduit that holds a section of the thermosiphon loop.

4. The IT enclosure of claim 1, wherein each of the one or more condensers has one or more fins that are immersed in the single-phase fluid and thermally coupled to the thermosiphon loop.

5. The IT enclosure of claim 1, wherein the tank includes an acceleration channel that directs the single-phase fluid over or through each of the one or more condensers at a higher flow rate than the single-phase fluid outside of the acceleration channel.

6. The IT enclosure of claim 5, wherein the acceleration channel is formed by one or more walls within the tank, and a first pump that is fluidly connected to the tank to pump the single-phase fluid from the acceleration channel resulting in the higher flow rate within the acceleration channel.

7. The IT enclosure of claim 6, further comprising a control server that is configured to control the first pump, based on a temperature of the electronics.

8. The IT enclosure of claim 7, wherein the control server is further configured to control a second pump that is fluidly connected to the liquid cooling loop to control a liquid flow rate within the liquid cooling loop, or a third pump that is fluidly connected to the single-phase fluid in the tank outside of the acceleration channel, based on the temperature of the electronics.

9. The IT enclosure of claim 1, wherein each of the one or more server chassis includes a printed circuit board that holds the electronics, and a cooling plate that is thermally coupled to the electronics, wherein the cooling plate includes a two-phase fluid line that circulates the two-phase fluid in the thermosiphon loop in vapor form, and receives the two-phase fluid from the thermosiphon loop in liquid form.

10. The IT enclosure of claim 9, wherein at least one of the one or more server chassis further includes a second cooling plate that is fluidly connected to the liquid cooling loop of the condenser and does not contain the two-phase fluid.

11. The IT enclosure of claim 1, wherein a first heat exchanger is fluidly coupled to the liquid cooling loop and a second heat exchanger is fluidly coupled to the single-phase fluid held in the tank, and a common cooling system supplies an external fluid to the first heat exchanger and the second heat exchanger.

12. A data center comprising:
a plurality of information technology (IT) enclosures, one or more of the IT enclosures including:
a tank that holds a single-phase fluid;
one or more server chassis immersed in the single-phase fluid within the tank; and
one or more condensers, each comprising
a thermosiphon loop that receives and returns a two-phase fluid from and to electronics which are housed by each of the one or more server chassis, and
a liquid cooling loop that is thermally coupled to the thermosiphon loop to condense the two-phase fluid from vapor to liquid.

13. The data center of claim 12, wherein each of the one or more condensers are immersed in and thermally coupled to the single-phase fluid within the tank.

14. The data center of claim 12, wherein each of the one or more condensers includes paths in which the single-phase fluid flows through such that the single-phase fluid is in direct contact with conduit that holds a section of the thermosiphon loop.

15. The data center of claim 12, wherein each of the one or more condensers has one or more fins that are immersed in the single-phase fluid and thermally coupled to the thermosiphon loop.

16. The data center of claim 12, wherein the tank includes an acceleration channel that directs the single-phase fluid over or through each of the one or more condensers at a higher flow rate than the single-phase fluid outside of the acceleration channel.

17. The data center of claim 16, wherein the acceleration channel informed by one or more walls within the tank, and a first pump that is fluidly connected to the tank to pump the single-phase fluid from the acceleration channel resulting in the higher flow rate within the acceleration channel.

18. The data center of claim 17, wherein the one or more of the IT enclosures further comprises a control server that is configured to control the first pump, based on a temperature of the electronics.

19. The data center of claim 18, wherein the control server is further configured to control a second pump that is fluidly connected to the liquid cooling loop to control a liquid flow rate within the liquid cooling loop, or a third pump that is fluidly connected to the single-phase fluid in the tank outside of the acceleration channel, based on the temperature of the electronics.

20. The data center of claim 12, wherein each of the one or more server chassis includes a printed circuit board that holds the electronics, and a cooling plate that is thermally coupled to the electronics, wherein the cooling plate includes a two-phase fluid line that circulates the two-phase fluid in the thermosiphon loop in vapor form, and receives the two-phase fluid from the thermosiphon loop in liquid form.

* * * * *